(12) United States Patent
Okuda et al.

(10) Patent No.: US 6,300,890 B1
(45) Date of Patent: Oct. 9, 2001

(54) DELTA-SIGMA MODULATOR AND AD CONVERTER

(75) Inventors: Takashi Okuda; Toshio Kumamoto; Yasuo Morimoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/716,241

(22) Filed: Nov. 21, 2000

(30) Foreign Application Priority Data

Jun. 1, 2000 (JP) ................................................. 12-164683

(51) Int. Cl.$^7$ ...................................................... H03M 3/00
(52) U.S. Cl. ........................... 341/143; 341/143; 341/76; 341/77; 341/155; 341/61; 341/141
(58) Field of Search ................................ 341/143, 67, 77, 341/76

(56) References Cited

U.S. PATENT DOCUMENTS 5,103,229 * 4/1992 Ribner .................................. 341/143
5,124,703 * 6/1992 Kaneaki et al. ......................... 341/77

FOREIGN PATENT DOCUMENTS 4-229722   8/1992  (JP) .
11-308110  11/1999 (JP) .

OTHER PUBLICATIONS

"Delta–Sigma Data Converters", IEEE Press, 1997, pp. 273–275.

* cited by examiner

*Primary Examiner*—Michael Tokar
*Assistant Examiner*—Lam T. Mai
(74) *Attorney, Agent, or Firm*—Burns, Doane, Swecker & Mathis, LLP

(57) ABSTRACT

A delta-sigma modulator comprises a 1-bit quantizer located for quantizing an analog signal applied thereto, and for outputting a first quantized digital signal, a 1-bit DA converter converting the first quantized digital signal into a quantized analog signal, a subtracting circuit for subtracting the quantized analog signal output from the 1-bit DA converter from the analog signal input to the 1-bit quantizer, and an input integrating circuit series including a series of one or more stages each of which includes a subtracter and an integrator for integrating an output of the subtracter, one subtracter at a first stage subtracting the quantized analog signal delayed by a delay element from an input analog signal input to the delta-sigma modulator, and one integrator at a final stage outputting its output to the 1-bit quantizer. A multiple-bit quantizer quantizes an analog output of the subtracting circuit and outputs a second quantized digital signal. A differentiator then calculates an Nth-order derivative of the second quantized digital signal from the multiple-bit quantizer, N being equal to a number of the one or more stages included in the input integrating circuit series, and an adder adds an output of the differentiator to the first quantized digital signal from the 1-bit quantizer.

8 Claims, 4 Drawing Sheets

$Y = X + (1-z^{-1})^2 Em$ $Y = X + (1-z^{-1})^N Em$

DELTA-SIGMA MODULATOR AND AD CONVERTER

BACKGROUND OF THE INVENTION

1. Field of the Invention

The present invention relates to a delta-sigma modulator (here on abbreviated as ΔΣ modulator) that uses a 1-bit quantizer, and also relates to an AD converter for converting an analog signal into an equivalent digital signal. More particularly, the present invention relates to an improvement in ΔΣ modulators and AD converters, which can quantize an input analog signal by means of a feedback loop including a 1-bit quantizer and reduce the quantization noise to the same level as a theory value expected when the quantization is performed using a feedback loop including a multiple-bit quantizer instead of the 1-bit quantizer.

2. Description of the Prior Art

Conventionally, such a ΔΣ modulator is disclosed in Japanese patent application publication (TOKKAIHEI) No. 4-229722 and Japanese patent application publication (TOKKAIHEI) No. 11-308110th. Referring now to FIG. 6, there is illustrated a block diagram showing the structure of a conventional ΔΣ modulator as disclosed in the references. In the figure, reference numeral 24 denotes an input terminal, numeral 25 denotes a first-stage subtracter, numeral 26 denotes a first-stage integrator, numeral 27 denotes a final-stage subtracter, numeral 28 denotes a final-stage integrator, numeral 29 denotes a 1-bit quantizer, numeral 30 denotes an output terminal, numeral 31 denotes 1-bit DA converter, and numeral 32 denotes a delay element.

In operation, when an input analog signal is input to the input terminal 24, the input analog signal is delivered to the 1-bit quantizer 29 through the first-stage subtracter 25, the first-stage integrator 26, the final-stage subtracter 27, and the final-stage integrator 28. At this time, the first-stage subtracter 25 outputs the input analog signal as it is when nothing has been input to the input terminal 24 before the input analog signal is input, and the final-stage subtracter 27 outputs a first-order integration value of the input analog signal input from the first-stage integrator 26 as it is. Therefore, a second-order integration value of the input analog signal is output from the final-stage integrator 28. The 1-bit quantizer 29 compares the value of the analog signal applied thereto with a predetermined threshold. The 1-bit quantizer 29 outputs a 1-bit digital value "1" when the value of the analog signal is greater than the threshold. When the value of the analog signal is less than the threshold, the 1-bit quantizer 29 outputs a 1-bit digital value "0".

When the 1-bit digital value output from the 1-bit quantizer 29 is "1", the 1-bit DA converter 31 outputs a quantized analog signal at the threshold level. In contrast, when the 1-bit digital value is "0", the 1-bit DA converter 31 outputs a quantized analog signal without any level. The delay element 32 delays this quantized analog signal by only one sampling time of the 1-bit quantizer 29. The first-stage subtracter 25 and the final-stage subtracter 27 output values obtained by subtracting the quantized analog signal from respective inputs applied thereto.

In such the ΔΣ modulator, quantization error dependent on the level difference between the threshold level in the 1-bit quantizer 29 and the input analog signal is generated without exception since the 1-bit quantizer 29 quantizes the input analog signal, and outputs the quantized analog signal as a digital signal value.

It is known to be able to decrease the quantization error theoretically by replacing the 1-bit quantizer 29 with a multiple-bit quantizer as shown in FIG. 7. In FIG. 7, reference numeral 33 denotes a multiple-bit quantizer, and numeral 34 denotes a multiple-bit DA converter. However, when replacing the quantizer with a multiple-bit one like this, it is necessary to also replace the 1-bit DA converter 31 with the multiple-bit DA converter 34. As a result, unit element circuit variations (Em_dac) in the multiple-bit DA converter 34 may result, and therefore the quantization error cannot be reduced to a theory value in actuality.

Referring next to FIG. 8, there is illustrated a block diagram showing the structure of another conventional ΔΣ modulator that can reduce the quantization error to the same level as a theory value expected when replacing the quantizer with a multiple-bit one. In the figure, reference numeral 35 denotes a multiple-bit quantizer, numeral 36 denotes a differentiator, numeral 37 denotes a differentiation integrator, and numeral 38 denotes an adder. The multiple-bit quantizer 35 quantizes a quantized analog signal from a 1-bit DA converter 31, and the differentiator 36 calculates the second derivative of the output of the multiple-bit quantizer 35. The differentiation integrator 37 performs a predetermined differentiation and integration process on a quantized digital signal from a 1-bit quantizer 29, and the adder 38 adds the output of the differentiator 36 to the output of the differentiation integrator 37 and outputs a digital signal by way of an output terminal 30.

Since the prior art ΔΣ modulator employs the 1-bit quantizer 29 for the feedback loop, further quantizes the quantized analog signal by means of the multiple-bit quantizer 35, and adds this result to the quantized digital signal output from the 1-bit quantizer 29, the prior art ΔΣ modulator can reduce the quantization noise to the same level as a theory value expected when the quantization is performed using the feedback loop including a multiple-bit quantizer instead of the 1-bit quantizer.

However, it is necessary to add various circuits, such as the differentiation integration circuit 37, the differentiator 36, and so on, between the 1-bit quantizer 29 and the adder 38, and between the multiple-bit quantizer 35 and the adder 38 for this additional processing, and, as a result, there is a problem that the circuit scale increases.

SUMMARY OF THE INVENTION

The present invention is proposed to solve the above-mentioned problem. It is therefore an object to provide a ΔΣ modulator and an AD converter capable of quantizing an input analog signal by means of a feedback loop including a 1-bit quantizer and reducing the quantization noise to the same level as a theory value expected when the quantization is performed by using a feedback loop including a multiple-bit quantizer, with fewer circuit scale than prior art ΔΣ modulators.

In accordance with an aspect of the present invention, there is provided a ΔΣ modulator comprising: an input terminal to which an input analog signal is input; an output terminal via which an output digital signal is output; a 1-bit quantizer located between the input terminal and the output terminal, for quantizing an analog signal applied thereto, and for outputting a first quantized digital signal; a 1-bit DA converter converting the first quantized digital signal into a quantized analog signal; a subtracting circuit for subtracting the quantized analog signal output from the 1-bit DA converter from the analog signal input to the 1-bit quantizer; a delay element for delaying the quantized analog signal from the 1-bit DA converter; an input integrating circuit series including a series of one or more stages each of which includes a subtracter and an integrator for integrating an output of the subtracter, one subtracter at a first stage subtracting the quantized analog signal delayed by the delay element from the input analog signal input to the input terminal, and one integrator at a final stage outputting its output to the 1-bit quantizer; a multiple-bit quantizer for quantizing an analog output of the subtracting circuit and for outputting a second quantized digital signal; a differentiator for calculating an Nth-order derivative of the second quantized digital signal from the multiple-bit quantizer, N being equal to a number of the one or more stages included in the input integrating circuit series; and an adder for adding an output of the differentiator to the first quantized digital signal from the 1-bit quantizer, and for outputting an addition result. Preferably, the input integrating circuit series includes a series of two or more stages, and one subtracter at a second or later stage subtracts the quantized analog signal delayed by the delay element from an output signal of one integrator at a stage immediately preceding to the second or later stage.

In accordance with a further aspect of the present invention, there is provided a ΔΣ modulator comprising: an input terminal to which an input analog signal is input; an output terminal via which an output digital signal is output; a 1-bit quantizer disposed on a signal route between the input terminal and the output terminal, for quantizing an analog signal applied thereto, and for outputting a first quantized digital signal; a 1-bit DA converter converting the first quantized digital signal into a quantized analog signal; a first delay element for delaying the quantized analog signal from the 1-bit DA converter; an input integrating circuit series including a series of one or more stages each of which includes a subtracter and an integrator for integrating an output of the subtracter, one subtracter at a first stage subtracting the quantized analog signal delayed by the first delay element from the input analog signal input to the input terminal, and one integrator at a final stage outputting its output to the 1-bit quantizer; a subtracting circuit for subtracting an analog signal output from one integrator at a stage immediately preceding the final stage from an analog signal output from the final-stage integrator; a multiple-bit quantizer for quantizing an analog output of the subtracting circuit and for outputting a second quantized digital signal; a differentiator for calculating an Nth-order derivative of the second quantized digital signal from the multiple-bit quantizer, N being equal to a number of the one or more stages included in the input integrating circuit series; a second delay element for delaying the first quantized digital signal; and an adder for adding an output of the differentiator to the first quantized digital signal delayed by the second delay element, and for outputting an addition result. Preferably, the input integrating circuit series includes a series of two or more stages, and one subtracter at a second or later stage subtracts the quantized analog signal delayed by the first delay element from an output signal of one integrator at a stage immediately preceding to the second or later stage.

In accordance with another aspect of the present invention, there is provided an AD converter comprising: a ΔΣ modulator including an input terminal to which an input analog signal is input, an output terminal via which an output digital signal is output, a 1-bit quantizer disposed on a signal route between the input terminal and the output terminal, for quantizing an analog signal applied thereto, and for outputting a first quantized digital signal, a 1-bit DA converter converting the first quantized digital signal into a quantized analog signal, a subtracting circuit for subtracting the quantized analog signal output from the 1-bit DA converter from the analog signal input to the 1-bit quantized, a delay element for delaying the quantized analog signal from the 1-bit DA converter, an input integrating circuit series including a series of one or more stages each of which includes a subtracter and an integrator for integrating an output of the subtracter, one subtracter at a first stage subtracting the quantized analog signal delayed by the delay element from the input analog signal input to the input terminal, and one integrator at a final stage outputting its output to the 1-bit quantizer, a multiple-bit quantizer for quantizing an analog output of the subtracting circuit and for outputting a second quantized digital signal, a differentiator for calculating an Nth-order derivative of the second quantized digital signal from the multiple-bit quantizer, N being equal to a number of the one or more stages included in the input integrating circuit series, and an adder for adding an output of the differentiator to the first quantized digital signal from the 1-bit quantizer; and a digital filter for performing a digital filtering process on a digital signal output from the ΔΣ modulator. Preferably, the input integrating circuit series of the ΔΣ modulator includes a series of two or more stages, and one subtracter at a second or later stage subtracts the quantized analog signal delayed by the delay element from an output signal of one integrator at a stage immediately preceding to the second or later stage.

In accordance with a further aspect of the present invention, there is provided an AD converter comprising: a ΔΣ modulator including an input terminal to which an input analog signal is input, an output terminal via which an output digital signal is output, a 1-bit quantizer disposed on a signal route between the input terminal and the output terminal, for quantizing an analog signal applied thereto, and for outputting a first quantized digital signal, a 1-bit DA converter converting the first quantized digital signal into a quantized analog signal, a first delay element for delaying the quantized analog signal from the 1-bit DA. converter, an input integrating circuit series including a series of one or more stages each of which includes a subtracter and an integrator for integrating an output of the subtracter, one subtracter at a first stage subtracting the quantized analog signal delayed by the first delay element from the input analog signal input to the input terminal, and one integrator at a final stage outputting its output to the 1-bit quantizer, a subtracting circuit for subtracting an analog signal output from one integrator at a stage immediately preceding the final stage from an analog signal output from the final-stage integrator, a multiple-bit quantizer for quantizing an analog output of the subtracting circuit and for outputting a second quantized digital signal, a differentiator for calculating an Nth-order derivative of the second quantized digital signal from the multiple-bit quantizer, N being equal to a number of the one or more stages included in the input integrating circuit series, a second delay element for delaying the first quantized digital signal, and an adder for adding an output of the differentiator to the first quantized digital signal delayed by the second delay element; and a digital filter for performing a digital filtering process on a digital signal output from the ΔΣ modulator. Preferably, the input integrating circuit series of the ΔΣ modulator includes a series of two or more stages, and one subtracter at a second or later stage subtracts the quantized analog signal delayed by the first delay element from an output signal of one integrator at a stage immediately preceding to the second or later stage.

Further objects and advantages of the present invention will be apparent from the following description of the preferred embodiments of the invention as illustrated in e accompanying drawings.

DETAILED DESCRIPTION OF THE PREFERRED EMBODIMENTS

Embodiment 1

Figure 1:
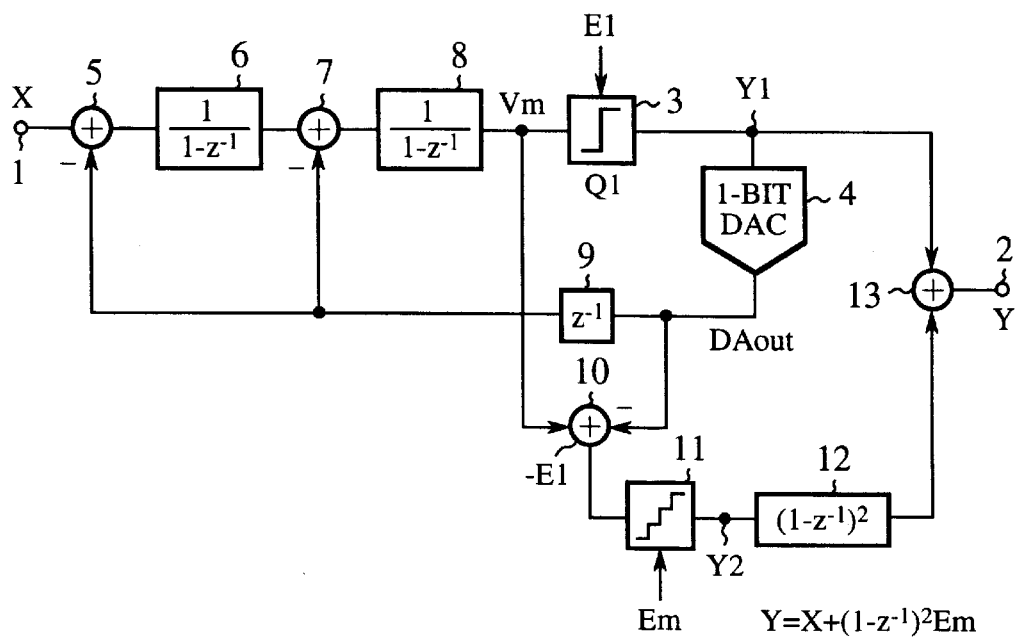
FIG. 1 is a block diagram showing a ΔΣ modulator according to a first embodiment of the present invention.

FIG. 1 is a block diagram showing a ΔΣ modulator according to a first embodiment of the present invention. In FIG. 1, reference numeral 1 denotes an input terminal to which an input analog signal is input, and numeral 2 denotes an output terminal for outputting an output digital signal, numeral 3 denotes a 1-bit quantizer located on a signal route between the input terminal 1 and the output terminal 2, for quantizing an analog signal applied thereto and for outputting a first quantized digital signal, numeral 4 denotes a 1-bit DA converter for converting the first quantized digital signal into an equivalent quantized analog signal, numeral 5 denotes a first-stage subtracter for subtracting the quantized analog signal from the input analog signal applied to the input terminal 1, numeral 6 denotes a first-stage integrator for integrating the output of the first-stage subtracter 5, numeral 7 denotes a final-stage subtracter for subtracting the quantized analog signal from the output signal of the first-stage integrator 6, numeral 8 denotes a final-stage integrator for integrating the output of the final-stage subtracter 7 and for outputting the integration result to the 1-bit quantizer 3, and numeral 9 denotes a delay element located between both the first-stage subtracter 5 and the final-stage subtracter 7 and the 1-bit DA converter 4.

In addition, numeral 10 denotes a subtracter for subtracting the output signal of the 1-bit DA converter 4 from the analog signal input to the 1-bit quantizer 3, numeral 11 denotes a multiple-bit quantizer for quantizing the analog output of the subtracter 10 and for outputting a second quantized digital signal, numeral 12 denotes a differentiator for calculating the second derivative of the output of the multiple-bit quantizer 11, and numeral 13 denotes an adder for adding the output of the differentiator 12 to the first quantized digital signal from the 1-bit quantizer 3, and for outputting the addition result.

In operation, when the input analog signal is input to the input terminal 1, the input analog signal is delivered to the 1-bit quantizer 3 through the first-stage subtracter 5, the first-stage integrator 6,the final-stage subtracter 7, and the final-stage integrator 8. At this time, the first-stage subtracter 5 outputs the input analog signal as it is when nothing has been input to the input terminal 1 before the input analog signal is input, and the final-stage subtracter 7 outputs the first-order integration value of the input analog signal input from the first-stage integrator 6 as it is. Therefore, the second-order integration value of the input analog signal is output from the final-stage integrator 8. The 1-bit quantizer 3 compares the analog signal applied thereto with a predetermined threshold, outputs a 1-bit digital value "1" when the analog signal has a value greater than the threshold, and outputs a 1-bit digital value "0" when the analog signal has a value less than the threshold.

The 1-bit DA converter 4 outputs a quantized analog signal according to the 1-bit digital value output from the 1-bit quantizer 3. When the digital value is "1", the 1-bit DA converter 4 outputs the quantized analog signal at the above-mentioned threshold level, and outputs the quantized analog signal without level when the digital value is "0". The delay element 9 delays the quantized analog signal by a sampling time of the 1-bit quantizer 3, and the first-stage subtracter 5 and the final-stage subtracter 7 output values obtained by subtracting the quantized analog signal delayed by the delay element 9 from respective inputs applied thereto.

Thus, the feedback loop using the 1-bit quantizer 3 repeatedly performs a sequential processing of subtracting the quantized analog signal from the input analog signal applied to the input terminal 1, and quantizing on the subtraction result. Therefore, the 1-bit quantizer 3 basically outputs a bit string including bits each having either a value of "1" when the second-order integration result of the input analog signal is equal to or greater than the threshold, or a value of "0" when the second-order integration result of the input analog signal is less than the threshold.

The subtracter 10 then subtracts the output signal of the 1-bit DA converter 4 from the analog signal input to the 1-bit quantizer 3. In other words, the subtracter 10 calculates the quantization error, i. e., the difference between the analog signal output from the final-stage integrator 8 and the quantized analog signal from the 1-bit DA converter 4. The multiple-bit quantizer 11 then quantizes this quantization error, and outputs a second quantized multiple-bit digital signal. The differentiator 12 then calculates the second derivative of the second quantized digital signal from the multiple-bit quantizer 11, and the adder 13 adds the second-order differentiated second quantized digital signal to the first quantized digital signal from the 1-bit quantizer 3. This process is the one for detecting a rapid increase in the quantization error, and performing the bit operation processing using the adder so as to correct the quantization error.

As mentioned above, the ΔΣ modulator in accordance with the first embodiment is provided with the subtracter 10 that subtracts a quantized analog signal from an analog signal input to the 1-bit quantizer 3, the multiple-bit quantizer 11 that quantizes the analog output of the subtracter 10 and outputs a second quantized digital signal, the differentiator 12 that calculates an Nth-order derivative of the output of the multiple-bit quantizer 11, N (in the present embodiment, two) being equal to the number of stages (each stage includes one subtracter and one integrator) included in the input integrating circuit series comprised of the circuits 5 to 8, and the adder 13 that adds the output of the differentiator 12 to a first quantized digital signal from the 1-bit quantizer 3 and outputs the addition result. Therefore, since the first embodiment includes the differentiator 12 located between the multiple-bit quantizer 11 and the adder 13, for calculating an Nth-order derivative of the output of the multiple-bit quantizer 11, N being equal to the number of stages (=2) included in the input integrating circuit series comprised of the circuits 5 to 8, without having to provide any circuit between the 1-bit quantizer 3 and the adder 13, the first embodiment provides an advantage of being able to reduce the circuit scale compared with the prior art.

In addition, the first embodiment offers an advantage of being able to quantize the input analog signal by means of the feedback loop including the 1-bit quantizer 3 and reduce the quantization noise to the same level as a theory value expected when the quantization is performed using the feedback loop including a multiple-bit quantizer instead of the 1-bit quantizer 3.

Next, a description will be made as to the performance of the ΔΣ modulator according to the first embodiment. Assuming that the input analog signal is X, the differentiation operator is Z−1, the value input to the 1-bit quantizer 3 is Vm, the quantization error in the 1-bit quantizer 3 is E1, the quantized digital value output from the 1-bit quantizer 3 is Y1, the output of the 1-bit DA converter 4 is DAout, the digital value output from the multiple-bit quantizer 11 is Y2, and the value output from the adder 13 is Y, the following equation (1) is obtained from a basic equation associated with an Nth order (=the number of integrators 6 and 8) modulator, and the following equation 2 is obtained because Y1≈DAout=Vm+E1.

$$Y1 = X + (1 - Z^{-1})^2 E1 \quad (1)$$

$$Y2 = -E1 + Em \quad (2)$$

And, the output Y of the ΔΣ modulator is given by the following equation (3), and this equation becomes the same as in a case of using a 2-bit quantizer in the ΔΣ loop. This means that the ΔΣ modulator according to the first embodiment has a low noise characteristic similar to the one in that case.

$$\begin{aligned} Y &= Y1 + Y2(1 - Z^{-1})^2 \quad (3) \\ &= X + (1 - Z^{-1})^2 E1 - (1 - Z^{-1})^2 E1 + (1 - Z^{-1})^2 Em \\ &= X + (1 - Z^{-1})^2 Em \end{aligned}$$

Embodiment 2

Figure 2:
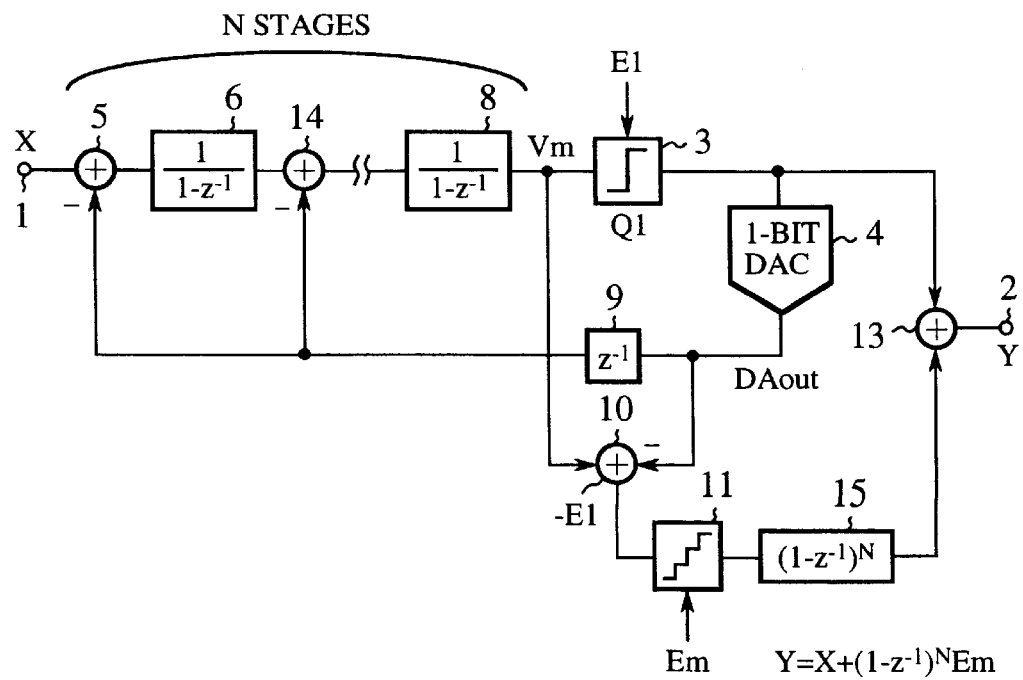
FIG. 2 is a block diagram showing a ΔΣ modulator according to a second embodiment of the present invention.

Referring next to FIG. 2, there is illustrated a block diagram showing the structure of a ΔΣ modulator according to a second embodiment of the present invention. The ΔΣ modulator of FIG. 2 includes a plurality of additional subtracters and a plurality of additional integrators located between a first-stage integrator 6 and a final-stage subtracter 7, so that an input integrating circuit series includes N stages each of which has one subtracter and one integrator for integrating the output of the subtracter, that is, the tonal number of integrators within the input integrating circuit series is N and the total number of subtracters within the input integrating circuit series is N. In FIG. 2, the same reference numerals as shown in FIG. 1 denote the same components as of the ΔΣ modulator according to the first embodiment mentioned above, and therefore the description of those components will be omitted hereinafter. Reference numeral 14 denotes a second-stage subtracter, and numeral 15 denotes a differentiator for calculating an Nth-order derivative of an output of a multiple-bit quantizer 11.

In operation, an analog signal input to an input terminal 1 is delivered to a 1-bit quantizer 3 through the N subtracters 5, 14, ..., and 7 and the N integrators 6, ..., and 8, i. e. , the input integrating circuit series extending from the first-stage subtracter 5 to the final-stage integrator 8. At this time, when nothing has been input to the input terminal 1 before the input analog signal is input, each of the N subtracters 5, 14, ..., and 7 outputs an input applied thereto as it is. While a quantized analog signal is input from a 1-bit DA converter 4, each of the N subtracters subtracts the quantized analog signal from the input applied thereto. Therefore, the 1-bit quantizer 3 basically outputs a bit string including bits each having either a value of "1" when the Nth-order integration result of the input analog signal is equal to or greater than a threshold, or a value of "0" when the Nth-order integration result of the input analog signal is less than the threshold.

Next, when a second quantized multiple-bit digital signal is output from the multiple-bit quantizer 11, the differentiator 15 calculates the Nth-order derivative of the second quantized digital signal. An adder 13 then adds the second quantized digital signal Nth-order differentiated to a first quantized digital signal output from the 1-bit quantizer 3. This process is the one of detecting a rapid increase in the quantization error, and performing the bit operation processing with the adder 13 so as to correct the quantization error. The ΔΣ modulator according to the second embodiment operates in the same way that the ΔΣ modulator of the first embodiment does, except that the additional components and so on operate in the above-mentioned way, and therefore the description about the operations of the same components as of the first embodiment will be omitted hereinafter.

As mentioned above, since the second embodiment includes the differentiator 15 located between the multiple-bit quantizer 11 and the adder 13, for calculating an Nth-order derivative of the second quantized digital signal from the multiple-bit quantizer 11, N being equal to the number of stages included in the input integrating circuit series comprised of the circuits 5 to 8, without having to provide any circuit between the 1-bit quantizer 3 and the adder 13, the second embodiment provides an advantage of being able to reduce the circuit scale compared with the prior art, like the first embodiment. Furthermore, the second embodiment offers an advantage of being able to quantize the input analog signal using the feedback loop including the 1-bit quantizer 3, and reduce the quantization noise to the same level as a theory value expected when the quantization is performed using the feedback loop including a multiple-bit quantizer instead of the 1-bit quantizer 3.

The equations (1) to (3) of the first embodiment can be extended to the following equations (4) to (6):

$$Y1 = X + (1 - Z^{-1})^N E1 \quad (4)$$

$$Y2 = -E1 + Em \quad (5)$$

$$\begin{aligned} Y &= Y1 + Y2(1 - Z^{-1})^N \quad (6) \\ &= X + (1 - Z^{-1})^N E1 - (1 - Z^{-1})^N E1 + (1 - Z^{-1})^N Em \\ &= X + (1 - Z^{-1})^N Em \end{aligned}$$

These equations are the same as those when an N-bit quantizer is used in the ΔΣ loop. This means that the ΔΣ modulator according to the second embodiment has a low noise characteristic similar to that in the case of using an N-bit quantizer. Furthermore, the same advantage as offered by the second embodiment is provided in the case of N=1, as can be seen from the above-mentioned equations.

Embodiment 3

Figure 3:
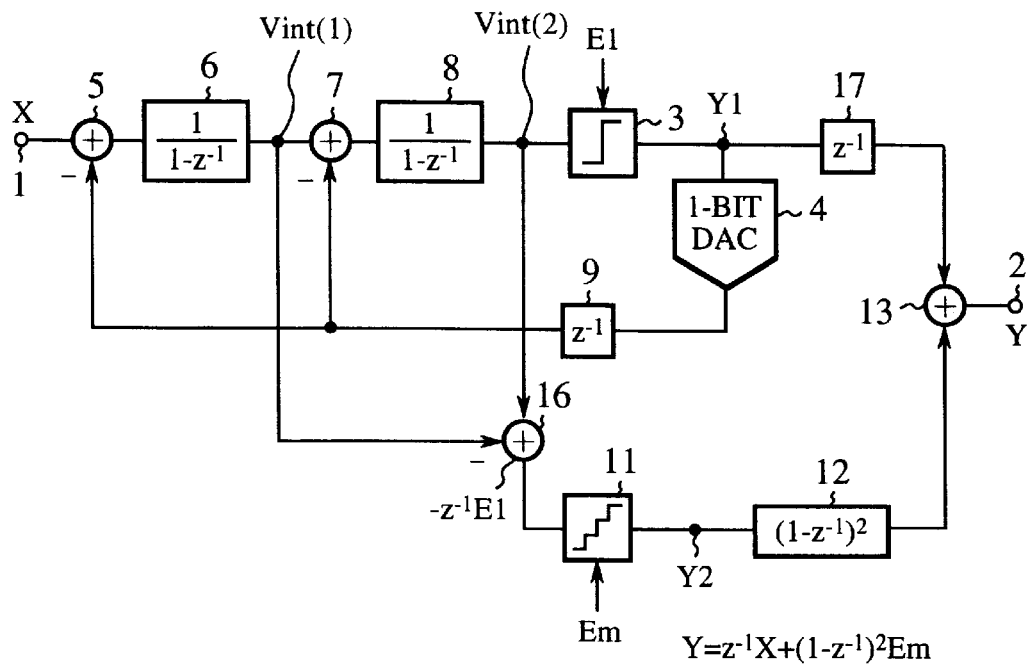
FIG. 3 is a block diagram showing a ΔΣ modulator according to a third embodiment of the present invention.

Referring next to FIG. 3, there is illustrated a block diagram showing a ΔΣ modulator according to a third embodiment of the present invention. In FIG. 3, the same reference numerals as shown in FIG. 1 denote the same components as of the ΔΣ modulator according to the first embodiment mentioned above, and therefore the description of those components will be omitted hereinafter. Reference numeral 16 denotes a subtracter for subtracting a signal input to a final-stage subtracter 7 from an analog signal input to a 1-bit quantizer 3, and for outputting the subtraction result to a multiple-bit quantizer 11, numeral 17 denotes a second delay element located between the 1-bit quantizer 3 and an adder 13. The second delay element 17 delays a signal applied thereto by the same delay time as that provided a first delay element 9.

In operation, the subtracter 16 subtracts a signal input to the final-stage subtracter 7 from the analog signal input to the 1-bit quantizer 3, and outputs the subtraction result to the multiple-bit quantizer 11. The multiple-bit quantizer 11 quantizes the quantization error, and outputs a second quantized multiple-bit digital signal. A differentiator 12 calculates the second derivative of the second quantized digital signal from the multiple-bit quantizer 11, and the adder 13 adds the second derivative of the second quantized digital signal to a first quantized digital signal from the 1-bit quantizer 3 which has been delayed by the second delay element 17.

Assuming that the signal input to the final-stage subtracter 7 is Vint(1), and the analog signal input to the 1-bit quantizer 3 is Vint(2), the following equations (7) to (9) are established, and, in addition, the following equation (10) is also established because Y−Vint(2)=E1:

$$\text{Vint}(1) = (X - Z^{-1}y)/(1 - Z^{-1}) \qquad (7)$$

$$\text{Vint}(2) = (\text{Vint}(1) - Z^{-1}y)/(1 - Z^{-1}) \qquad (8)$$

$$\text{Vint}(2) - \text{Vint}(1) = Z^{-1}(\text{Vint}(2) - Y) \qquad (9)$$

$$\text{Vint}(2) - \text{Vint}(1) = -Z^{-1}E1 \qquad (10)$$

On the other hand, since the following equation (11) holds, the following equation (12) is established if the signal input from the 1-bit quantizer 3 to the adder 13 is $Z^{-1}Y1$.

$$Y2 = -Z^{-1}E1 + Em \qquad (11)$$

$$\begin{aligned} Y &= Z^{-1}Y1 + (1 - Z^{-1})^2 Y2 \\ &= Z^{-1}X + (1 - Z^{-1})^2 Em \end{aligned} \qquad (12)$$

This equation is the same as that in the case of providing a 2-bit quantizer within the ΔΣ loop. This means that the ΔΣ modulator according to the third embodiment has a low noise characteristic similar to that in the case of providing a 2-bit quantizer in the ΔΣ loop.

The ΔΣ modulator according to the third embodiment operates in the same way that the ΔΣ modulator of the first embodiment does, except that the additional components and so on operate in the above-mentioned way, and therefore the description about the operations of the same components as of the first embodiment will be omitted hereinafter.

As mentioned above, according to the third embodiment, the ΔΣ modulator comprises the subtracter 16 that subtracts an analog signal output from the integrator 6 at the former stage of the final-stage integrator 8 from the analog signal output from the final-stage integrator, the multiple-bit quantizer 11 that quantizes the analog output of the subtracter 16 and outputs a second quantized digital signal, the differentiator 12 that calculates an Nth-order (in this embodiment, N=2) derivative of the output of multiple-bit quantizer 11, N being equal to the number of stages included in the input integrating circuit series comprised of the circuits 5 to 8, the second delay element 17 that delays a first quantized digital signal from the 1-bit quantizer 3, and the adder 13 that adds the output of the second delay element 17 to the output of the differentiator 12. Accordingly, since only the second delay element 17 that delays the first quantized digital signal is installed between the 1-bit quantizer 3 and the adder 13, and only the differentiator 12 that calculates an Nth-order derivative of the input, N being equal to the number of stages included in the input integrating circuit series comprised of circuits 5 to 8, is installed between the multiple-bit quantizer 11 and the adder 13, the third embodiment offers an advantage of being able to reduce the circuit scale compared with the prior art.

Furthermore, the third embodiment provides an advantage of being able to quantize the input analog signal using the feedback loop including the 1-bit quantizer 3 and reduce the quantization noise to the same level as a theory value expected when the quantization is performed using the feedback loop including a multiple-bit quantizer instead of the 1-bit quantizer 3.

Embodiment 4

Figure 4:
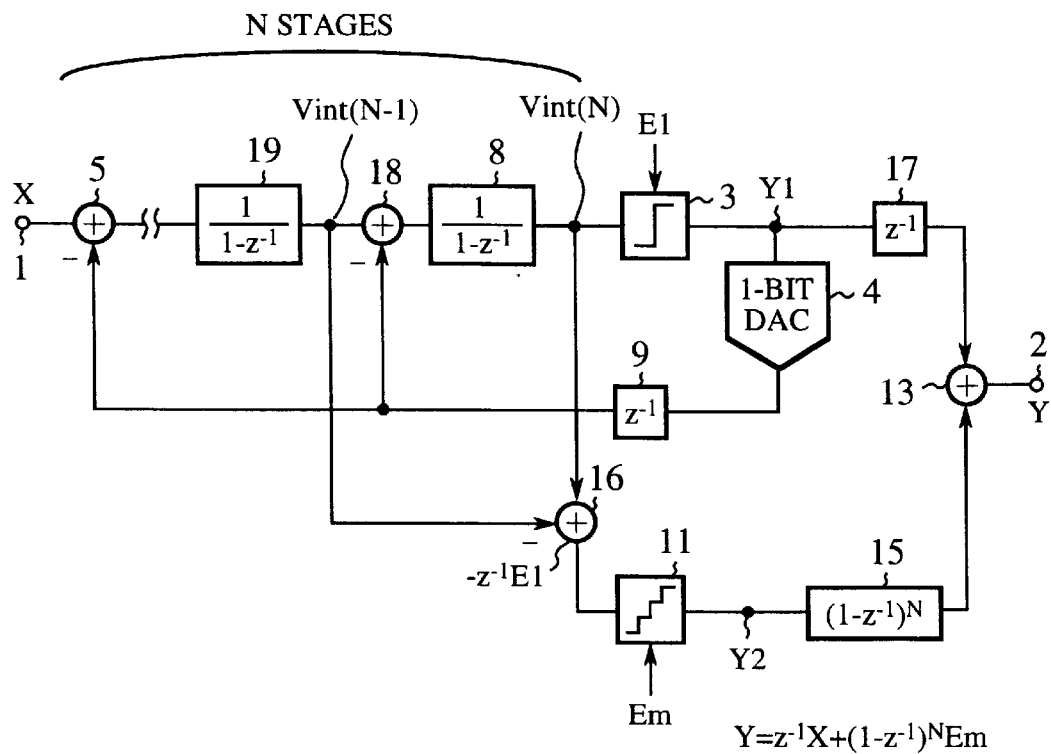
FIG. 4 is a block diagram showing a ΔΣ modulator according to a fourth embodiment of the present invention.

Referring next to FIG. 4, there is illustrated a block diagram showing a ΔΣ modulator according to a fourth embodiment of the present invention. The ΔΣ modulator of this embodiment includes an input integrating circuit series including N stages each of which has one subtracter and one integrator for integrating the output of the subtracter, like the ΔΣ modulator of the above-mentioned second embodiment. In FIG. 4, the same reference numerals as shown in FIGS. 2 and 3 denote the same components as of the ΔΣ modulators according to the second and third embodiments mentioned above, and therefore the description of those components will be omitted hereinafter. Reference numeral 18 denotes a final-stage subtracter, and numeral 19 denotes a pre-final-stage subtracter located at the front of the final-stage subtracter 18, for delivering a signal to the final-stage subtracter 18.

In operation, a subtracter 16 subtracts a signal input to the final-stage subtracter 18 from an analog signal input to the 1-bit quantizer 3, and outputs the subtraction result to the multiple-bit quantizer 11. The multiple-bit quantizer 11 quantizes the quantization error, and outputs a second quantized multiple-bit digital signal. A differentiator 15 calculates an Nth-order derivative of the second quantized digital signal from the multiple-bit quantizer 11, and an adder 13 adds the Nth-order derivative of the second quantized digital signal to a first quantized digital signal from the 1-bit quantizer 3 which has been delayed by a second delay element 17. The ΔZ modulator according to the fourth embodiment operates in the same way that the ΔΣ modulator of the second embodiment does, except that the additional components and so on operate in the above-mentioned way, and therefore the description about the operations of the same components as of the second embodiment will be omitted hereinafter.

As mentioned above, according to the fourth embodiment, the ΔΣ modulator comprises the subtracter 16 that subtracts the analog signal input to the final-stage subtracter 18 from the analog signal output from the final-stage integrator 8, and outputs the subtraction result to the multiple-bit quantizer 11, the multiple-bit quantizer 11 that quantizes the analog output of the subtracter 16 and outputs a second quantized digital signal, the differentiator 15 that calculates an Nth-order derivative of the output of the multiple-bit quantizer 11, N being equal to the number of stages included in the input integrating circuit series comprised of the circuits 5 to 8, the second delay element 17 that delays a first quantized digital signal from the 1-bit quantizer 3, and the adder 13 that adds the output of the second delay element 17 to the output of the differentiator 15. Accordingly, since only the second delay element 17 that delays the first quantized digital signal is installed between the 1-bit quantizer 3 and the adder 13, and only the differentiator 15 that calculates an Nth-order derivative of the input, N being equal to the number of stages included in the input integrating circuit series comprised of the circuits 5 to 8, is installed between the multiple-bit quantizer 11 and the adder 13, the fourth embodiment offers an advantage of being able to reduce the circuit scale compared with the prior art.

Furthermore, the fourth embodiment provides an advantage of being able to quantize the input analog signal using the feedback loop including the 1-bit quantizer 3 and reduce the quantization noise to the same level as a theory value expected when the quantization is performed using the feedback loop including a multiple-bit quantizer instead of the 1-bit quantizer 3.

Embodiment 5

Figure 5:
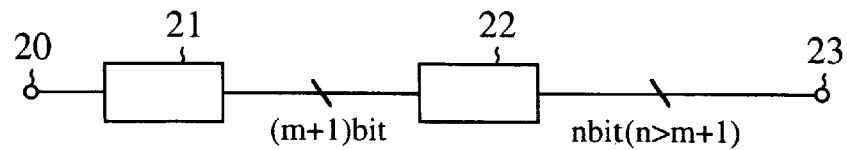
FIG. 5 is a block diagram showing an AD converter structure according to a fifth embodiment of the present invention.
Figure 6:
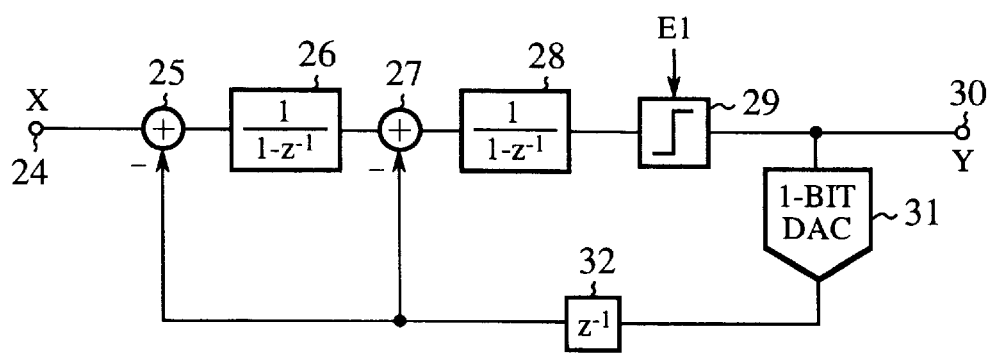
FIG. 6 is a block diagram showing the structure of a prior art ΔΣ modulator.
Figure 7:
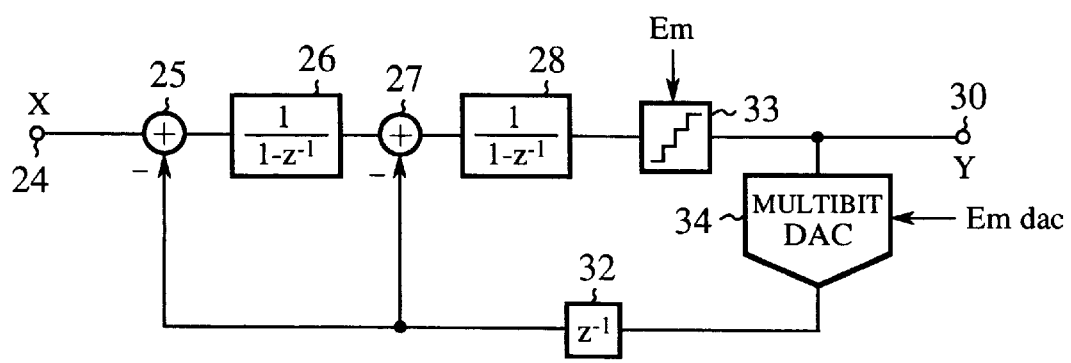
FIG. 7 is a block diagram showing the structure of another prior art ΔΣ modulator.
Figure 8:
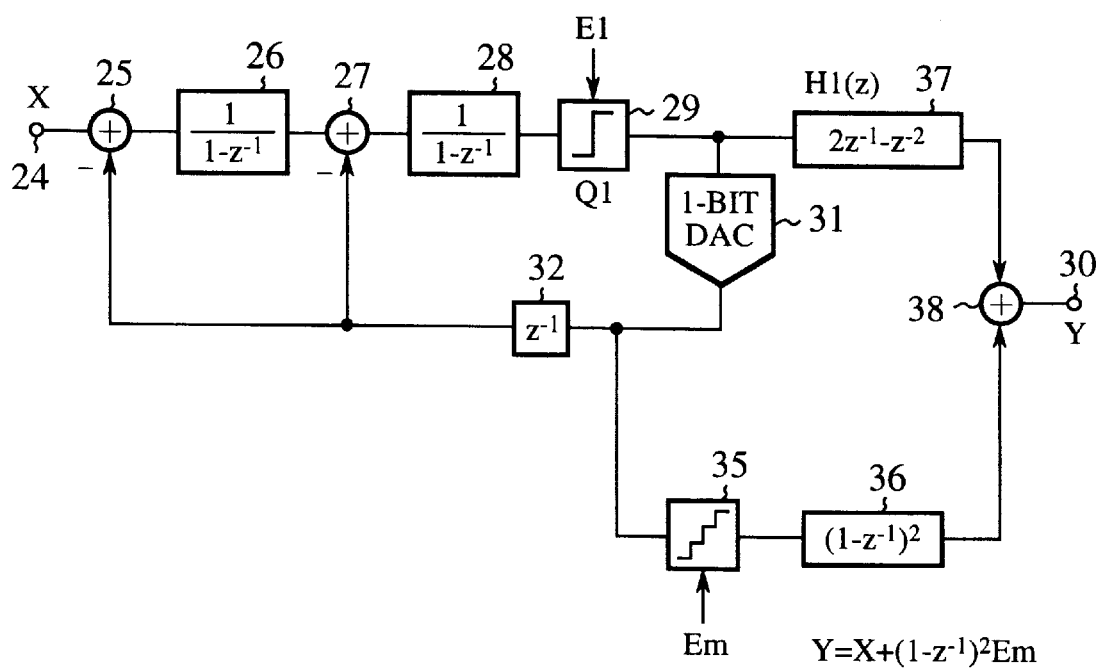
FIG. 8 is a block diagram showing the structure of another prior art ΔΣ modulator.

Referring next to FIG. 5, there is illustrated a block diagram showing the structure of an AD converter according to a fifth embodiment of the present invention. The AD converter can be used for signals in a speech band. In the figure, reference numeral 20 denotes an input terminal via which an input analog signal is input the AD converter, and numeral 21 denotes a ΔΣ modulator according to the above-mentioned first embodiment for quantizing the input analog signal and for outputting an (m+1)-bit digital signal, numeral 22 denotes a decimation filter (or digital filter) for performing a digital filtering process on the (m+1)-bit digital signal, and numeral 23 denotes an output terminal via which the decimation filter 22 outputs an n-bit digital signal, where n>m+1.

In operation, the input analog signal input from the input terminal 20 is delivered to the ΔΣ modulator 21 where it is quantized to an (m+1)-bit digital signal. The decimation filter 22 performs a digital filtering process on the (m+1)-bit digital signal, and outputs an n-bit digital signal by way of output terminal 23.

As mentioned above, the AD converter according to the fifth embodiment has the ΔΣ modulator 21 according to the first embodiment and the decimation filter 22 to which a digital signal is applied. Accordingly, the fifth embodiment offers an advantage of being able to reduce the circuit scale compared with the prior art and to reduce the quantization noise.

It is needless to say to be able to construct an AD converter that can similarly reduce the circuit scale compared with the prior art and can reduce the quantization noise, using a ΔΣ modulator according to any one of the second through fourth embodiments, instead of the ΔΣ modulator 21 of the first embodiment.

Many widely different embodiments of the present invention may be constructed without departing from the spirit and scope of the present invention. It should be understood that the present invention is not limited to the specific embodiments described in the specification, except as defined in the appended claims.

What is claimed is:

1. A delta-sigma modulator comprising:
an input terminal to which an input analog signal is input;
an output terminal via which an output digital signal is output;
a 1-bit quantizer located between said input terminal and said output terminal, for quantizing an analog signal applied thereto, and for outputting a first quantized digital signal;
a 1-bit DA converter converting the first quantized digital signal into a quantized analog signal;
a subtracting means for subtracting the quantized analog signal output from said 1-bit DA converter from the analog signal input to said 1-bit quantizer;
a delay element for delaying the quantized analog signal from said 1-bit DA converter;
an input integrating circuit series including a series of one or more stages each of which includes a subtracter and an integrator for integrating an output of the subtracter, one subtracter at a first stage subtracting the quantized analog signal delayed by said delay element from the input analog signal input to said input terminal, and one integrator at a final stage outputting its output to said 1-bit quantizer;
a multiple-bit quantizer for quantizing an analog output of said subtracting means and for outputting a second quantized digital signal;
a differentiator for calculating an Nth-order derivative of the second quantized digital signal from said multiple-bit quantizer, N being equal to a number of said one or more stages included in said input integrating circuit series; and
an adder for adding an output of said differentiator to the first quantized digital signal from said 1-bit quantizer, and for outputting an addition result.

2. The delta-sigma modulator according to claim 1, wherein said input integrating circuit series includes a series of two or more stages, and one subtracter at a second or later stage subtracts the quantized analog signal delayed by said delay element from an output signal of one integrator at a stage immediately preceding to the second or later stage.

3. A delta-sigma modulator comprising:
an input terminal to which an input analog signal is input;
an output terminal via which an output digital signal is output;
a 1-bit quantizer disposed on a signal route between said input terminal and said output terminal, for quantizing an analog signal applied thereto, and for outputting a first quantized digital signal;
a 1-bit DA converter converting the first quantized digital signal into a quantized analog signal;
a first delay element for delaying the quantized analog signal from said 1-bit DA converter;
an input integrating circuit series including a series of one or more stages each of which includes a subtracter and an integrator for integrating an output of the subtracter, one subtracter at a first stage subtracting the quantized analog signal delayed by said first delay element from the input analog signal input to said input terminal, and one integrator at a final stage outputting its output to said 1-bit quantizer;
a subtracting means for subtracting an analog signal output from one integrator at a stage immediately preceding the final stage from an analog signal output from said final-stage integrator;
a multiple-bit quantizer for quantizing an analog output of said subtracting means and for outputting a second quantized digital signal;

a differentiator for calculating an Nth-order derivative of the second quantized digital signal from said multiple-bit quantizer, N being equal to a number of said one or more stages included in said input integrating circuit series;

a second delay element for delaying the first quantized digital signal; and an adder for adding an output of said differentiator to the first quantized digital signal delayed by said second delay element, and for outputting an addition result.

4. The delta-sigma modulator according to claim 3, wherein said input integrating circuit series includes a series of two or more stages, and one subtracter at a second or later stage subtracts the quantized analog signal delayed by said first delay element from an output signal of one integrator at a stage immediately preceding to the second or later stage.

5. An AD converter comprising:

a delta-sigma modulator including an input terminal to which an input analog signal is input, an output terminal via which an output digital signal is output, a 1-bit quantizer disposed on a signal route between said input terminal and said output terminal, for quantizing an analog signal applied thereto, and for outputting a first quantized digital signal, a 1-bit DA converter converting the first quantized digital signal into a quantized analog signal, a subtracting means for subtracting the quantized analog signal output from said 1-bit DA converter from the analog signal input to said 1-bit quantizer, a delay element for delaying the quantized analog signal from said 1-bit DA converter, an input integrating circuit series including a series of one or more stages each of which includes a subtracter and an integrator for integrating an output of the subtracter, one subtracter at a first stage subtracting the quantized analog signal delayed by said delay element from the input analog signal input to said input terminal, and one integrator at a final stage outputting its output to said 1-bit quantizer, a multiple-bit quantizer for quantizing an analog output of said subtracting means and for outputting a second quantized digital signal, a differentiator for calculating an Nth-order derivative of the second quantized digital signal from said multiple-bit quantizer, N being equal to a number of said one or more stages included in said input integrating circuit series, and an adder for adding an output of said differentiator to the first quantized digital signal from said 1-bit quantizer; and a digital filter for performing a digital filtering process on a digital signal output from said delta-sigma modulator.

6. The AD converter according to claim 5, wherein said input integrating circuit series of said delta-sigma modulator includes a series of two or more stages, and one subtracter at a second or later stage subtracts the quantized analog signal delayed by said delay element from an output signal of one integrator at a stage immediately preceding to the second or later stage.

7. An AD converter comprising:

a delta-sigma modulator including an input terminal to which an input analog signal is input, an output terminal via which an output digital signal is output, a 1-bit quantizer disposed on a signal route between said input terminal and said output terminal, for quantizing an analog signal applied thereto, and for outputting a first quantized digital signal, a 1-bit DA converter converting the first quantized digital signal into a quantized analog signal, a first delay element for delaying the quantized analog signal from said 1-bit DA converter, an input integrating circuit series including a series of one or more stages each of which includes a subtracter and an integrator for integrating an output of the subtracter, one subtracter at a first stage subtracting the quantized analog signal delayed by said first delay element from the input analog signal input to said input terminal, and one integrator at a final stage outputting its output to said 1-bit quantizer, a subtracting means for subtracting an analog signal output from one integrator at a stage immediately preceding the final stage from an analog signal output from said final-stage integrator, a multiple-bit quantizer for quantizing an analog output of said subtracting means and for outputting a second quantized digital signal, a differentiator for calculating an Nth-order derivative of the second quantized digital signal from said multiple-bit quantizer, N being equal to a number of said one or more stages included in said input integrating circuit series, a second delay element for delaying the first quantized digital signal, and an adder for adding an output of said differentiator to the first quantized digital signal delayed by said second delay element; and a digital filter for performing a digital filtering process on a digital signal output from said delta-sigma modulator.

8. The AD converter according to claim 7, wherein said input integrating circuit series of said delta-sigma modulator includes a series of two or more stages, and one subtracter at a second or later stage subtracts the quantized analog signal delayed by said first delay element from an output signal of one integrator at a stage immediately preceding to the second or later stage.

* * * * *